United States Patent
Ramakrishna et al.

(10) Patent No.: US 8,558,399 B2
(45) Date of Patent: Oct. 15, 2013

(54) DUAL MOLDED MULTI-CHIP PACKAGE SYSTEM

(75) Inventors: Kambhampati Ramakrishna, Chandler, AZ (US); Il Kwon Shim, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/443,067

(22) Filed: Apr. 10, 2012

(65) Prior Publication Data

US 2012/0193805 A1 Aug. 2, 2012

Related U.S. Application Data

(63) Continuation of application No. 11/618,806, filed on Dec. 30, 2006, now Pat. No. 8,178,982.

(51) Int. Cl.
 *H01L 23/28* (2006.01)
(52) U.S. Cl.
 USPC ........... 257/787; 257/685; 257/686; 257/777; 257/790; 257/E21.499; 257/E21.502; 257/E21.503; 257/E25.013; 257/E25.018; 257/E25.021; 257/E23.116; 257/E23.129; 438/109
(58) Field of Classification Search
 USPC ......... 257/486, 696, 685, 686, 777, 790, 787, 257/E23.141, E21.502, E21.503, E21.705, 257/E25.027, E25.021, E25.018, E21.013, 257/E25.006, E21.499, E23.116, E23.129; 438/107–109
 See application file for complete search history.

(56) References Cited

U.S. PATENT DOCUMENTS

| | | | |
|---|---|---|---|
| 5,239,198 A * | 8/1993 | Lin et al. ........................ | 257/693 |
| 5,353,498 A | 10/1994 | Fillion et al. | |
| 6,078,505 A | 6/2000 | Turudic | |
| 6,159,767 A | 12/2000 | Eichelberger | |
| 6,300,679 B1 * | 10/2001 | Mukerji et al. ............... | 257/738 |

(Continued)

FOREIGN PATENT DOCUMENTS

| | | | |
|---|---|---|---|
| JP | 2000133767 A | 5/2000 | |
| JP | 2001060657 A | 3/2001 | |

(Continued)

OTHER PUBLICATIONS

Office Action for Japanese Application No. 339497/2007 dated Jun. 19, 2012.

(Continued)

*Primary Examiner* — Ermias Woldegeorgis
(74) *Attorney, Agent, or Firm* — Ishimaru & Associates LLP; I-Chang John Yang

(57) ABSTRACT

A dual molded multi-chip package system is provided including forming an embedded integrated circuit package system having a first encapsulation partially covering a first integrated circuit die and a lead connected thereto, mounting a semiconductor device over the first encapsulation and connected to the lead, and forming a second encapsulation over the semiconductor device and the embedded integrated circuit package system.

10 Claims, 10 Drawing Sheets

(56) References Cited

U.S. PATENT DOCUMENTS

| | | |
|---|---|---|
| 6,309,912 B1 | 10/2001 | Chiou et al. |
| 6,946,325 B2 | 9/2005 | Yean et al. |
| 7,084,513 B2 | 8/2006 | Matsuki et al. |
| 7,208,345 B2 * | 4/2007 | Meyer et al. ............ 438/109 |
| 7,294,587 B2 | 11/2007 | Ashai et al. |
| 7,312,405 B2 | 12/2007 | Hsu |
| 7,408,254 B1 * | 8/2008 | Kim et al. ............ 257/686 |
| 7,548,430 B1 * | 6/2009 | Huemoeller et al. ...... 361/760 |
| 7,619,901 B2 | 11/2009 | Eichelberger et al. |
| 2001/0052647 A1 | 12/2001 | Plepys et al. |
| 2004/0080025 A1 | 4/2004 | Kasahara et al. |
| 2005/0006737 A1 | 1/2005 | Islam et al. |
| 2005/0184377 A1 | 8/2005 | Takeuchi et al. |
| 2006/0197210 A1 * | 9/2006 | Kim ............................ 257/686 |
| 2008/0157402 A1 | 7/2008 | Ramakrishna et al. |
| 2009/0315170 A1 | 12/2009 | Shim et al. |

FOREIGN PATENT DOCUMENTS

| | | |
|---|---|---|
| JP | 2001320015 A | 11/2001 |
| JP | 2002134653 | 5/2002 |
| JP | 2005317903 | 11/2005 |
| JP | 2006120943 A | 5/2006 |
| JP | 2006295051 A | 10/2006 |

OTHER PUBLICATIONS

Office Action for JP Application No. 339497/2007 dated Apr. 2, 2013.

* cited by examiner

DUAL MOLDED MULTI-CHIP PACKAGE SYSTEM

CROSS-REFERENCE TO RELATED APPLICATION(S)

This application is a Continuation of co-pending U.S. application Ser. No. 11/618,806 filed Dec. 30, 2006, and the subject matter thereof is hereby incorporated herein by reference thereto.

TECHNICAL FIELD

The present invention relates generally to integrated circuit packages and more particularly to multi-chip package system.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a printed circuit board substrate onto which a set of separate integrated circuit components are attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, the individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. The substrate and integrated circuit are often damaged during assembly or testing, complicating the manufacturing process and increasing costs. The vertically stacked integrated circuit problems can be greater than the benefits.

In addition, multi-chip packages generally provide higher density of integrated circuits but present yet other challenges. Additional structures, such as printed circuit boards, interposers, or flexible wiring, must be currently used to connect the integrated circuits in the multi-chip package. These additional structures add cost, manufacturing complexity, potential failure areas, and potential reliability problems.

Thus, a need still remains for a dual molded multi-chip package system providing low cost manufacturing, improved yield, and decreased size for the integrated circuit package system. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a dual molded multi-chip package system including forming an embedded integrated circuit package system having a first encapsulation partially covering a first integrated circuit die and a lead connected thereto, mounting a semiconductor device over the first encapsulation and connected to the lead, and forming a second encapsulation over the semiconductor device and the embedded integrated circuit package system.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
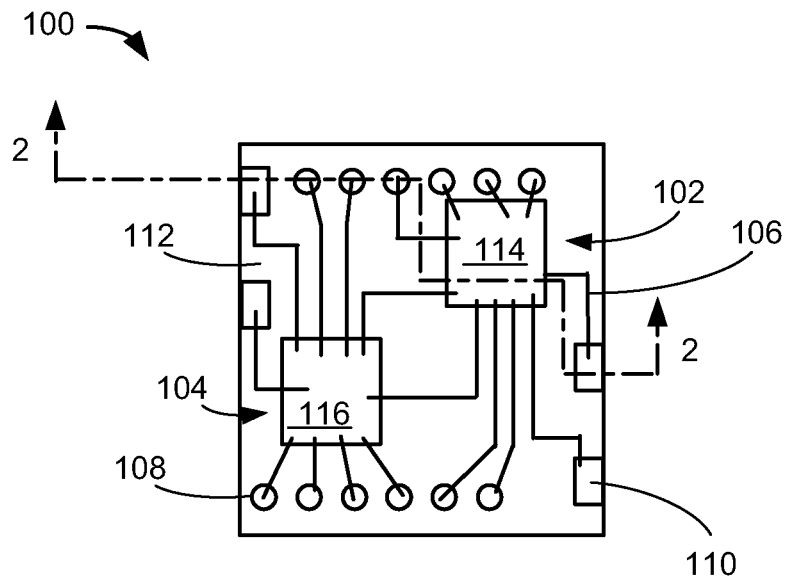
FIG. 1 is a bottom plan view of a dual molded multi-chip package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom plan view of a dual molded multi-chip package system 100 in an embodiment of the present invention. The bottom plan view depicts the dual molded multi-chip package system 100 without a solder mask that will be described in FIG. 17. The bottom plan view depicts a first integrated circuit die 102 and a second integrated circuit die 104 connected by traces 106, such as routing traces.

The traces 106 are entirely planar and in direct contact with a bottom surface of the first encapsulation 112. The traces 106 are further depicted as exposed to the external environment not internal to the first encapsulation 112. The traces 106 connect the first integrated circuit die 102 and the second integrated circuit die 104 with external interconnects 108.

The external interconnects 108 are depicted exposed to the external environment, and can be a solder ball or solder bumps, that are formed in direct contact with an end of the traces 106. The traces 106 further connect between and are in direct contact with the first integrated circuit die 102 and leads 110. The first integrated circuit die 102 and the second integrated circuit die 104 are both between the leads 110.

A first encapsulation 112, such as an epoxy mold compound, is around the first integrated circuit die 102, the second integrated circuit die 104, and the traces 106. The first encapsulation 112 exposes a first active side 114 of the first integrated circuit die 102 and a second active side 116 of the second integrated circuit die 104.

Figure 2:
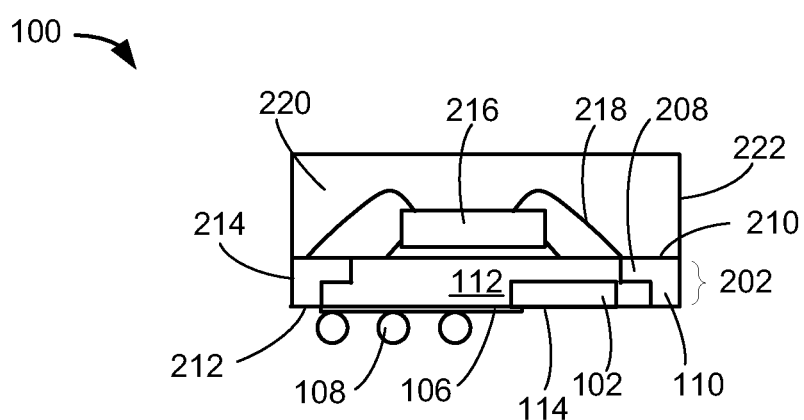
FIG. 2 is a cross-sectional view of the dual molded multi-chip package system along a line segment 2-2 of FIG. 1.

Referring now to FIG. 2, therein is shown a cross-sectional view of the dual molded multi-chip package system 100 along a line segment 2-2 of FIG. 1. The cross-sectional view depicts the dual molded multi-chip package system 100 including an embedded integrated circuit package system 202. The embedded integrated circuit package system 202 has the first integrated circuit die 102, the second integrated circuit die 104 of FIG. 1, and the leads 110 partially encapsulated in the first encapsulation 112. The first active side 114 and the second active side 116 of FIG. 1 are substantially coplanar.

Each of the leads 110 has an extension 208, a first surface 210, and a second surface 212. For example, the extension 208 may be a lead finger of the leads 110. The first surface 210 is the surface including the extension 208. The second surface 212 is the opposite surface of the first surface 210.

The cross-sectional view depicts the first encapsulation 112 partially covering the leads 110, the extension 208, and the first integrated circuit die 102. The first encapsulation 112 exposes the first surface 210, the second surface 212, and periphery sides 214 of the leads 110. The first encapsulation 112, the leads 110, the extension 208, the first integrated circuit die 102, the second integrated circuit die 104, and the traces 106 are over the external interconnects 108.

The leads 110 with the extension 208 may form mold locks improving the dual molded multi-chip package system 100 in moisture sensitivity level (MSL) test. The second surface 212 and the periphery sides 214 may be used for further connections to the next system level (not shown), such as another integrated circuit package system, another dual molded multi-chip package system, or a printed circuit board. For illustrative purposes, the cross-sectional view depicts the extension 208 substantially the same between the leads 110, although it is understood that the extension 208 may differ.

A semiconductor device 216, such as an integrated circuit die, is over the embedded integrated circuit package system 202. Internal interconnects 218, such as bond wires or ribbon bond wires, are between the semiconductor device 216 and the leads 110. The extension 208 or the first surface 210 may serve as bond pads for the internal interconnects 218. The leads 110 may serve as communication structures between the semiconductor device 216 and the first integrated circuit die 102 as well as between the semiconductor device 216 and the second integrated circuit die 104. The leads 110 are not traditional electrical vias, wherein the electrical vias are defined as electrical conduction structures between different conduction levels and surrounded by insulating material, such as a dielectric.

A second encapsulation 220 covers the semiconductor device 216, the internal interconnects 218, the first surface 210, and a surface of the first encapsulation 112 approximate to the first surface 210. The cross-sectional view depicts encapsulation sides 222 of the second encapsulation 220 and the periphery sides 214 of the leads 110 as substantially coplanar. For illustrative purposes, the encapsulation sides 222 and the periphery sides 214 are shown as substantially coplanar, although it is understood that the encapsulation sides 222 and the periphery sides 214 may not be coplanar, such as the encapsulation sides 222 may have an angled configuration.

Figure 3:
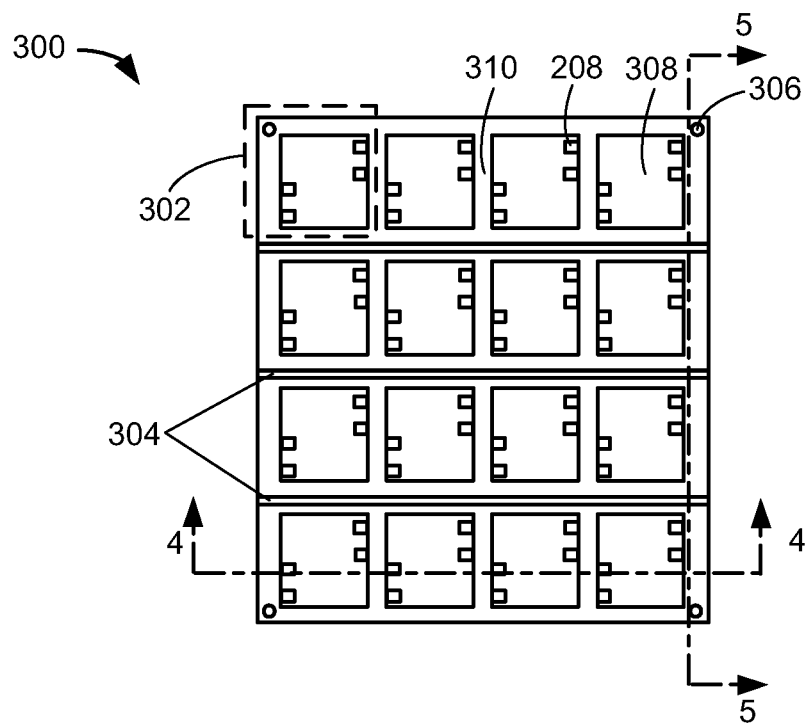
FIG. 3 is a top view of a lead frame in an embodiment of the present invention.

Referring now to FIG. 3, therein is shown a top view of a lead frame 300 in an embodiment of the present invention. The lead frame 300 has an array of window frames 302, strip lines 304, and holes 306. The lead frame 300 is used to form the dual molded multi-chip package system 100 of FIG. 1.

Each of the window frames 302 has an opening 308 in a frame 310 and a number of instances of the extension 208 extending into the opening 308 at opposite sides of the frame 310. The window frames 302, the opening 308, and the extension 208 may be formed by a number of different processes, such as stamping, etching, half etching, or preformed. For illustrative purposes, the extension 208 is shown not extending from side to side of the frame 310, although it is understood that the extension 208 may extend from side to side of the frame 310.

The holes 306, such as through holes or grooves, are at the corners of the lead frame 300 and may be serve as alignment guides for further processing of the lead frame 300. The holes 306 may be formed by a number of different processes, such as stamping, etching, or preformed.

For illustrative purposes, the holes 306 are shown at the corners of the lead frame 300, although it is understood that the holes 306 may be at different locations of the lead frame 300. Also for illustrative purposes, the lead frame 300 has the holes 306 as potential alignment guides although it is understood that the lead frame 300 may have different alignment structures, such as notches along the sides of the lead frame 300.

The strip lines 304 are between rows of the window frames 302. The strip lines 304 may be formed by a number of different processes, such as half etching. For illustrative purposes, the top view depicts the strip lines 304 delineating rows of the window frames 302, although it is understood that the strip lines 304 may delineate columns of the window frames 302.

Figure 4:
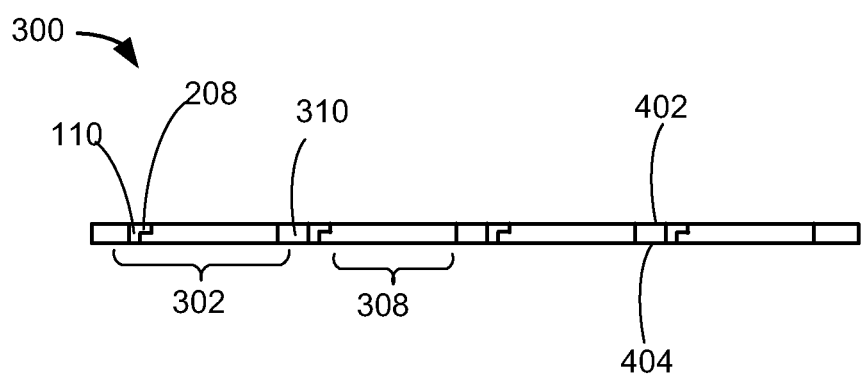
FIG. 4 is a first cross-sectional view of the lead frame along a line segment 4-4 of FIG. 3.

Referring now to FIG. 4, therein is shown a first cross-sectional view of the lead frame 300 along a line segment 4-4 of FIG. 3. The first cross-sectional view depicts the window frames 302 having the frame 310. The leads 110 and the extension 208 of each of the leads 110 extend from the frame 310 into the opening 308. Instances of the extension 208 at the opposite sides of the frame 310 are along a top side 402 of the lead frame 300.

For illustrative purposes, the instances of the extension 208 are shown at the top side 402, although it is understood that the instances of the extension 208 may not be at the top side 402, such as a bottom side 404 of the frame 310. Also for illustrative purposes, the instances of the extension 208 are shown at the top side 402, although it is understood that the instances of the extension 208 may not be along the same side of the frame 310.

Figure 5:
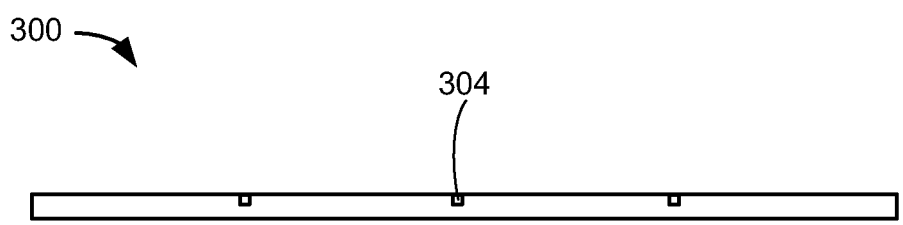
FIG. 5 is a second cross-sectional view of the lead frame along a line segment 5-5 of FIG. 3.

Referring now to FIG. 5, therein is shown a second cross-sectional view of the lead frame 300 along a line segment 5-5 of FIG. 3. The second cross-sectional view shows the strip lines 304 as recesses in the lead frame 300. The strip lines 304 do not affect the structural rigidity of the lead frame 300 to withstand handling of the lead frame 300 for further processing.

Figure 6:
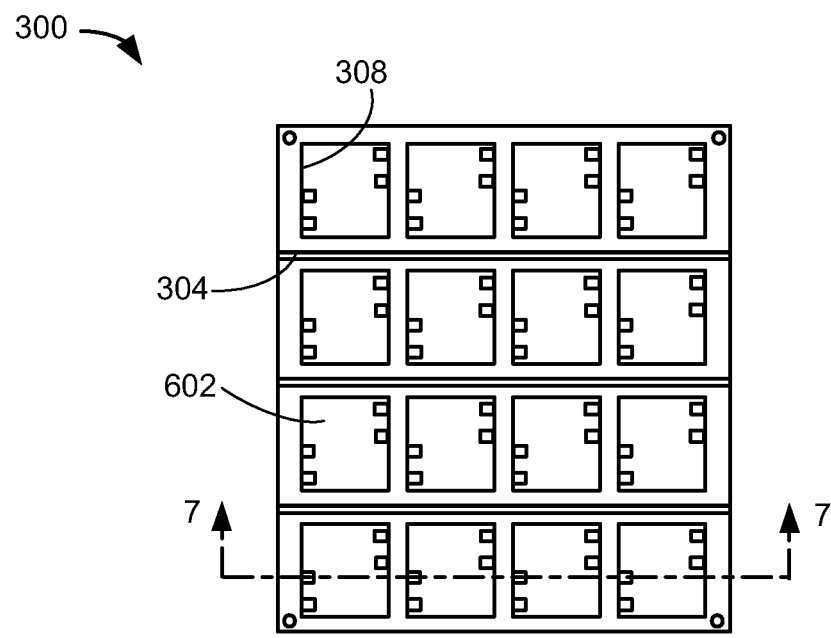
FIG. 6 is the structure of FIG. 3 in a taping phase.

Referring now to FIG. 6, therein is shown the structure of FIG. 3 in a taping phase. A tape 602, such as a coverlay tape, is attached on the bottom side 404 of FIG. 4 of the lead frame 300. The tape 602 is visible through the opening 308. The strip lines 304 are shown not affected by the tape 602.

Figure 7:
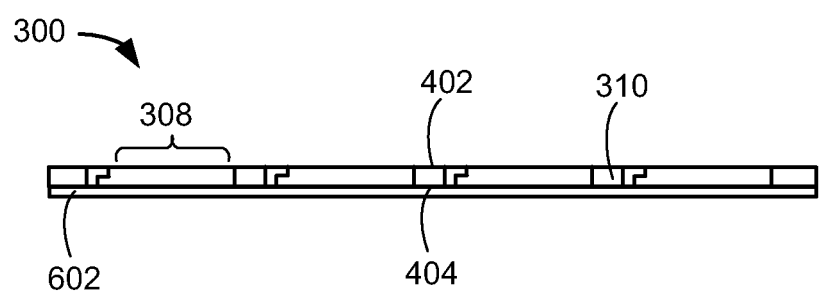
FIG. 7 is a cross-sectional view of the structure of FIG. 6 along a line segment 7-7 of FIG. 6.

Referring now to FIG. 7 is a cross-sectional view of the structure of FIG. 6 along a line segment 7-7 of FIG. 6. The tape 602 along the bottom side 404 of the lead frame 300 forms a substantially coplanar surface in the opening 308 and the frame 310. The top side 402 is shown as unaffected by the tape 602.

Figure 8:
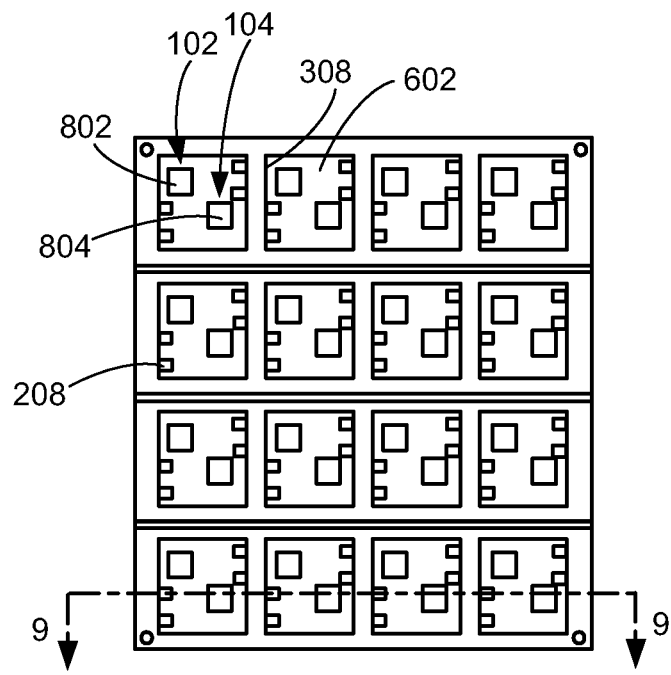
FIG. 8 is the structure of FIG. 6 in a die-attaching phase.

Referring now to FIG. 8, therein is shown the structure of FIG. 6 in a die-attaching phase. The first integrated circuit die 102 and the second integrated circuit die 104 are placed in the opening 308 in each of the window frames 302 and over the tape 602. The first integrated circuit die 102 having a first non-active side 802 and the second integrated circuit die 104 having a second non-active side 804 are facing down such that the first non-active side 802 and the second non-active side 804 are shown and not facing the tape 602. The extension 208 do not impede the first integrated circuit die 102 and the second integrated circuit die 104 in the opening 308.

Figure 9:
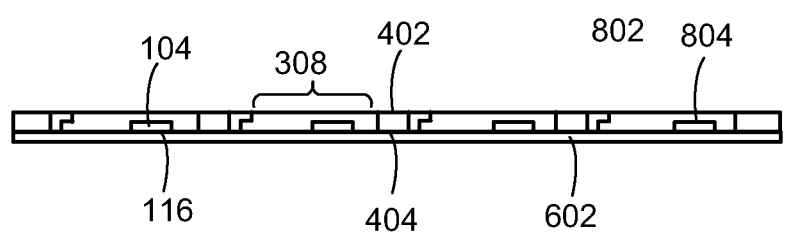
FIG. 9 is a cross-sectional view of the structure of FIG. 8 along a line segment 9-9 of FIG. 8.

Referring now to FIG. 9, therein is shown a cross-sectional view of the structure of FIG. 8 along a line segment 9-9 of FIG. 8. The first integrated circuit die 102 of FIG. 8 having the first active side 114 of FIG. 1 and the second integrated circuit die 104 having the second active side 116 are facing down in the opening 308. The first active side 114 and the second active side 116 face and are on the tape 602. The first active side 114, the second active side 116, and the bottom side 404 are substantially coplanar. The top side 402 is above the first non-active side 802 and the second non-active side 804.

Figure 10:
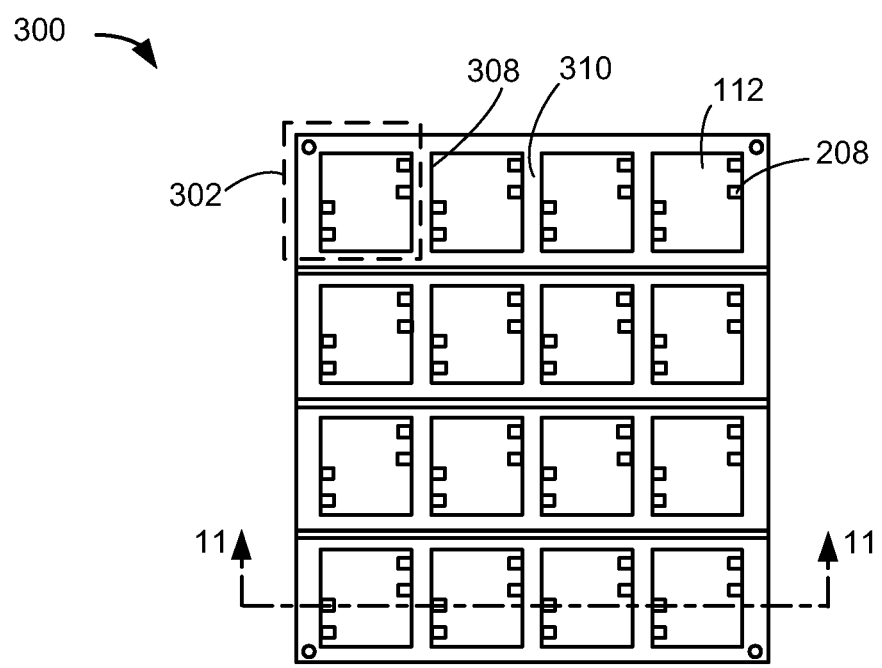
FIG. 10 is the structure of FIG. 8 in a first molding phase.

Referring now to FIG. 10, therein is shown the structure of FIG. 8 in a first molding phase. A molding compound, such as an epoxy mold compound, fills the opening 308 of each of the window frames 302 forming the first encapsulation 112. The first encapsulation 112 outlines the opening 308 and exposes the instances of the extension 208 of the frame 310. The first encapsulation 112 may be formed by a number of different processes, such as screen print or transfer molding. A planarization process may be performed to expose the extension 208.

Figure 11:
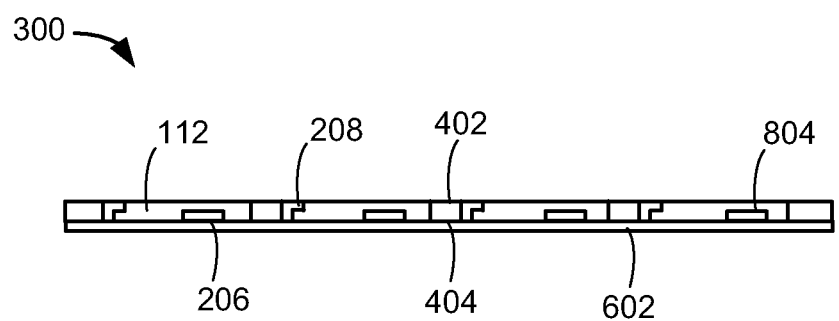
FIG. 11 is a cross-sectional view of the structure of FIG. 10 along a line segment 11-11 of FIG. 10.

Referring now to FIG. 11, therein is shown a cross-sectional view of the structure of FIG. 10 along a line segment 11-11 of FIG. 10. The cross-sectional view depicts the tape 602 attached to the bottom side 404. The tape 602 helps shape the first encapsulation 112 to be coplanar with the first active side 114 of FIG. 1 and the second active side 116. The first encapsulation 112 fills the opening 308 in the lead frame 300 and covers the first non-active side 802 of FIG. 8 and the second non-active side 804. The first encapsulation 112 exposes the extension 208 and the top side 402.

Figure 12:
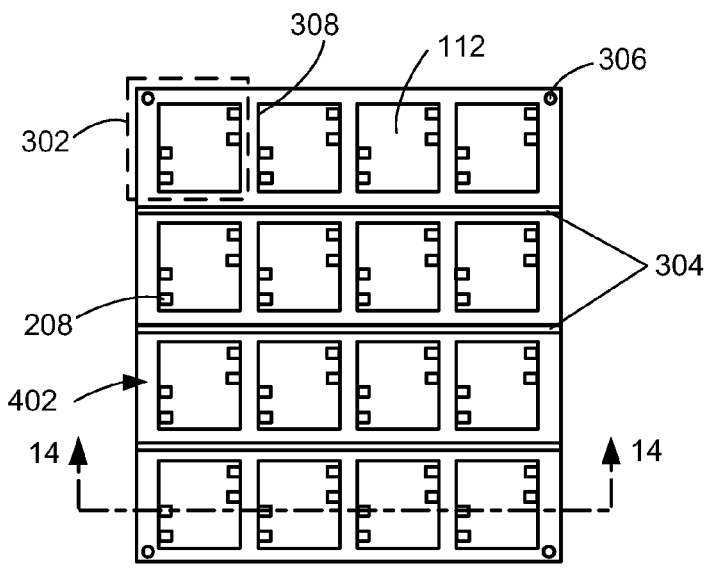
FIG. 12 is the structure of FIG. 10 in a de-taping phase.

Referring now to FIG. 12, therein is shown the structure of FIG. 10 in a de-taping phase. The top view shown depicts the top side 402 and similar to that shown in FIG. 10. The first encapsulation 112 is in the opening 308 of each of the window frames 302 and exposes the instances of the extension 208. The holes 306 are not filled by the first encapsulation 112. The strip lines 304 are shown not affected by the first encapsulation 112.

Figure 13:
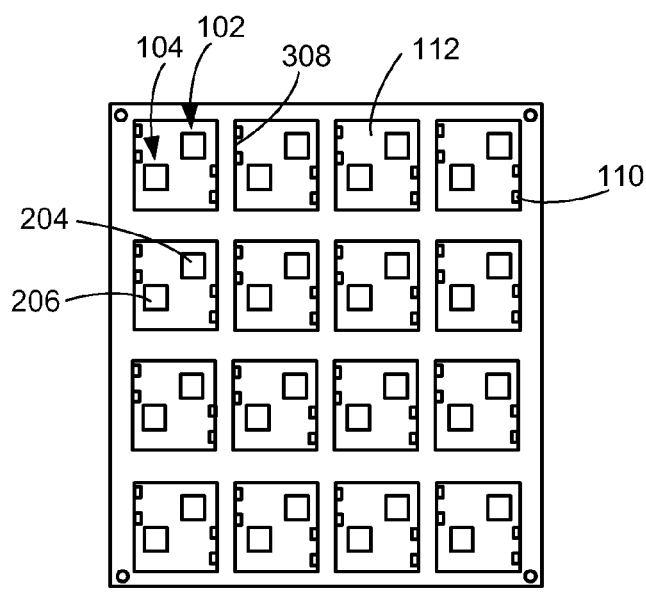
FIG. 13 is a bottom view of FIG. 12.

Referring now to FIG. 13, therein is shown a bottom view of FIG. 12. The bottom view depicts the tape 602 of FIG. 11 removed. The opening 308 has the first encapsulation 112, the first integrated circuit die 102, the second integrated circuit die 104, and the leads 110. The first encapsulation 112 exposes the first active side 114, the second active side 116, and the leads 110.

Figure 14:
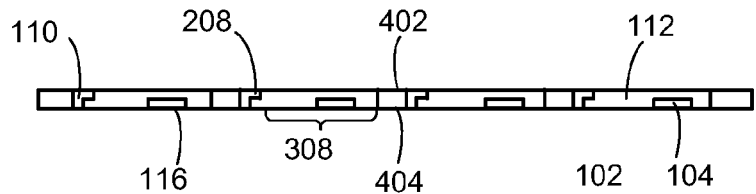
FIG. 14 is a cross-sectional view of the structure of FIG. 12 along a line segment 14-14 of FIG. 12.

Referring now to FIG. 14, therein is shown a cross-sectional view of the structure of FIG. 12 along a line segment 14-14 of FIG. 12. The cross-sectional view depicts the first encapsulation 112 exposing the second active side 116. The first active side 114 of FIG. 1, the second active side 116, the bottom side 404, the leads 110, and the first encapsulation 112 along the bottom side 404 are substantially coplanar. The first encapsulation 112 fills the opening 308 covering the first integrated circuit die 102 and the second integrated circuit die 104 excluding the first active side 114 and the second active side 116. The first encapsulation 112 also exposes the extension 208 and the top side 402.

Figure 15:
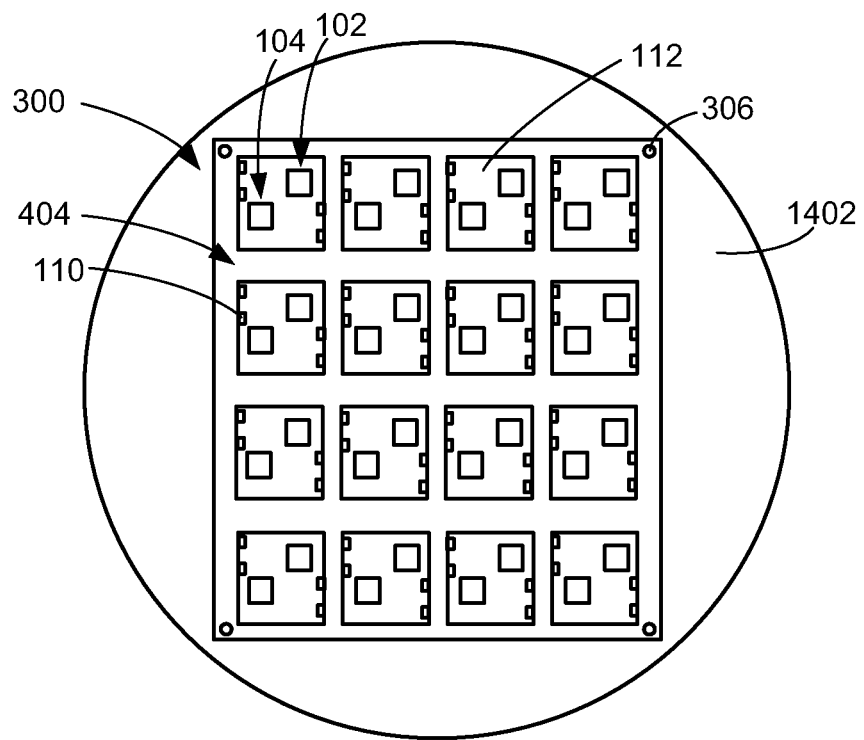
FIG. 15 is the structure of FIG. 13 in a mounting phase.

Referring now to FIG. 15, therein is shown the structure of FIG. 13 in a mounting phase. The structure of FIG. 13 is mounted on a support structure 1402, such as a wafer carrier, with the bottom side 404 facing up. The support structure 1402 helps keeps the structure of FIG. 13 planar for further processing. The lead frame 300 has the first integrated circuit die 102 and the second integrated circuit die 104 exposed and in the first encapsulation 112. The first encapsulation 112 also exposes the leads 110 from the lead frame 300. The holes 306 may be used with pins (not shown) from the support structure 1402 for aligning the lead frame 300.

Figure 16:
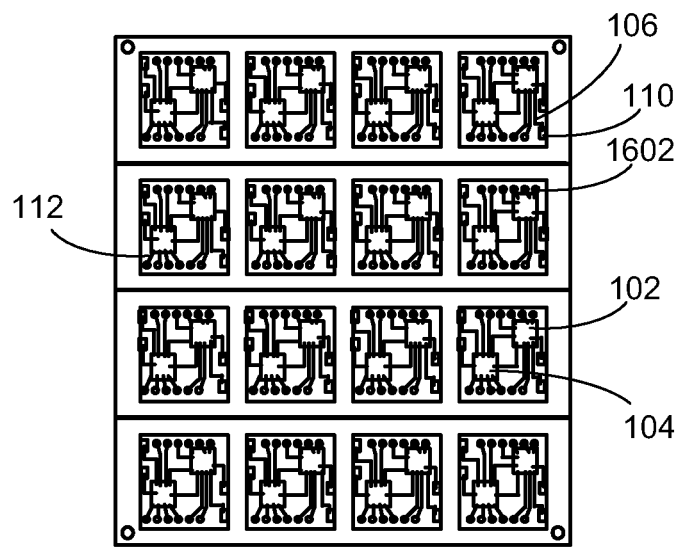
FIG. 16 is the structure of FIG. 15 in a route-forming phase.

Referring now to FIG. 16, therein is shown the structure of FIG. 15 in a route-forming phase. Bond sites 1602 and the traces 106 are formed on the first encapsulation 112. The traces 106 connect the first integrated circuit die 102 and the second integrated circuit die 104. The traces 106 also connect both the first integrated circuit die 102 and the second integrated circuit die 104 with the bond sites 1602 and the leads 110. The bond sites 1602 and the traces 106 may be formed by a number of different processes, such as depositing conductive materials.

For illustrative purposes, the bond sites 1602 are shown at the periphery of the first encapsulation 112, although it is understood that the bond sites 1602 may be at other locations, such as at an interior region of the first encapsulation 112. Also for illustrative purposes, the traces 106 are shown as routing for the first integrated circuit die 102, the second integrated circuit die 104, the leads 110, and the bond sites 1602, although it is understood that the traces 106 may provide additional functions, such as a redistribution structure or forming a circuit element. Alternatively, the top side 402 of FIG. 12 may also have the traces 106 and the bond sites 1602.

Figure 17:
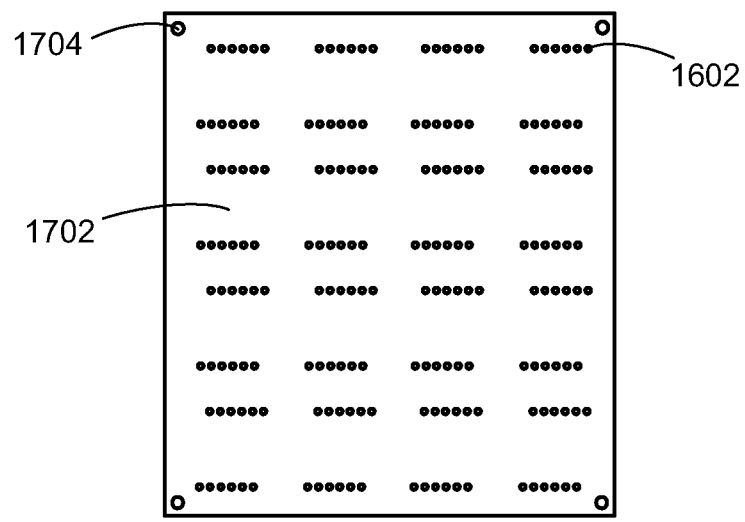
FIG. 17 is the structure of FIG. 16 in a masking phase.

Referring now to FIG. 17, therein is the structure of FIG. 16 in a masking phase. A solder mask 1702 is formed over the structure of FIG. 16. The solder mask 1702 has alignment guides 1704 that align with the holes 306 of FIG. 12. The solder mask 1702 exposes the bond sites 1602 for further processing.

Figure 18:
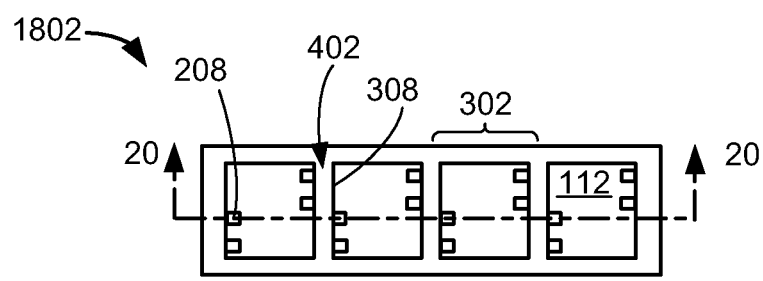
FIG. 18 is the structure of FIG. 17 in a strip-forming phase.

Referring now to FIG. 18, therein is shown the structure of FIG. 17 in a strip-forming phase. The structure of FIG. 17 undergoes a singulation process forming a lead frame strip 1802. The lead frame 300 shown in FIG. 15 is singulated at the strip lines 304 shown in FIG. 3. The singulation process may be performed by a number of different processes, such as sawing or punching. The top side 402 of the lead frame strip 1802 depicts the window frames 302 with the opening 308. The first encapsulation 112 is in the opening 308 and exposing the extension 208.

Figure 19:
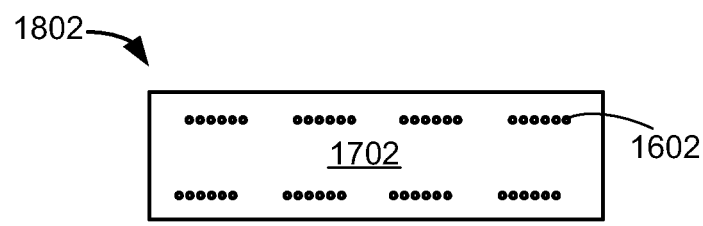
FIG. 19 is a bottom view of FIG. 18.

Referring now to FIG. 19, therein is shown a bottom view of FIG. 18. The bottom view depicts the lead frame strip 1802 with the solder mask 1702 exposing the bond sites 1602.

Figure 20:
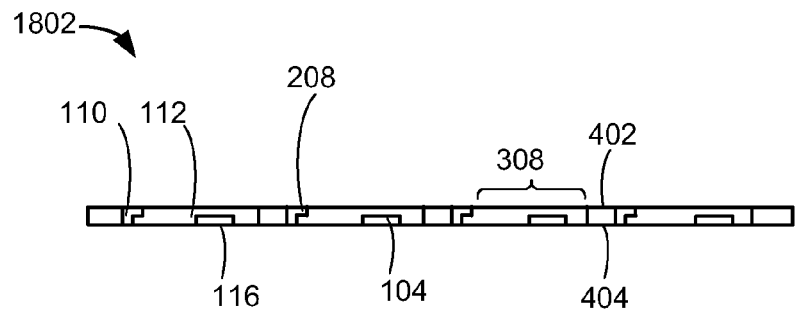
FIG. 20 is a cross-sectional view of the structure of FIG. 18 along a line segment 20-20 of FIG. 18.

Referring now to FIG. 20, therein is shown a cross-sectional view of the structure of FIG. 18 along a line segment 20-20 of FIG. 18. The cross-sectional view depicts the lead frame strip 1802 with the first encapsulation 112 exposing the second active side 116. The first active side 114 of FIG. 1, the second active side 116, the bottom side 404, the leads 110, and the first encapsulation 112 along the bottom side 404 are substantially coplanar. The first encapsulation 112 fills the opening 308 covering the first integrated circuit die 102 of FIG. 1 and the second integrated circuit die 104 excluding the first active side 114 and the second active side 116. The first encapsulation 112 also exposes the extension 208 and the top side 402.

Figure 21:
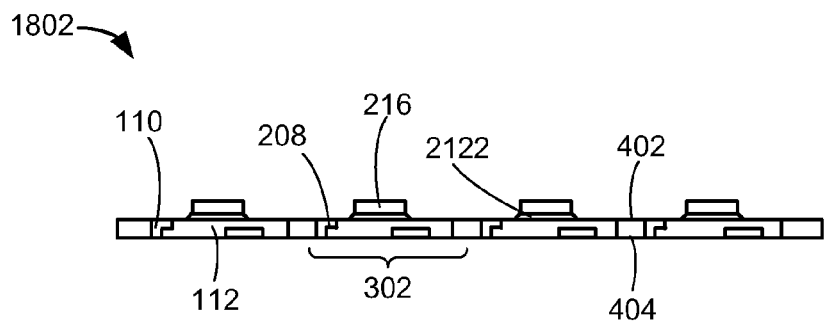
FIG. 21 is the structure of FIG. 20 in a device-stacking phase.

Referring now to FIG. 21, therein is shown the structure of FIG. 20 in a device-stacking phase. The semiconductor device 216 mounts over the first encapsulation 112 along the top side 402 of the lead frame strip 1802. The semiconductor device 216 mounts on the first encapsulation 112 with an adhesive 2122, such as a die-attach adhesive, in each of the window frames 302. The adhesive 2122 and the semiconductor device 216 do not impede or contaminate the top side 402 of the extension 208 and the leads 110. The bottom side 404 of the lead frame strip 1802 is shown as unaffected.

Figure 22:
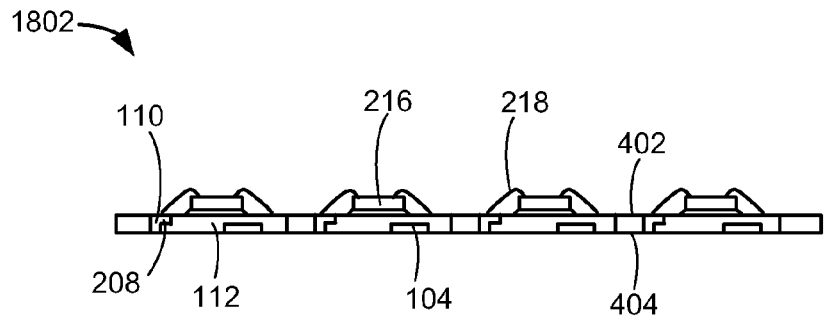
FIG. 22 is the structure of FIG. 21 in a device-connecting phase.

Referring now to FIG. 22, therein is shown the structure of FIG. 21 in a device-connecting phase. The lead frame strip 1802 undergoes an electrical connecting process. The internal interconnects 218 attach the semiconductor device 216 and the extension 208 or the top side 402 of the leads 110. The internal interconnects 218 may be attached by a number of different processes, such a wire bonding. The internal interconnects 218 may form electrical connections between the semiconductor device 216 and the first integrated circuit die 102 of FIG. 1 as well as the second integrated circuit die 104. The electrical connections are formed with the extension 208, the leads 110, the bond sites 1602 of FIG. 16, and the traces 106 of FIG. 16 without traditional electrical vias (not shown).

Figure 23:
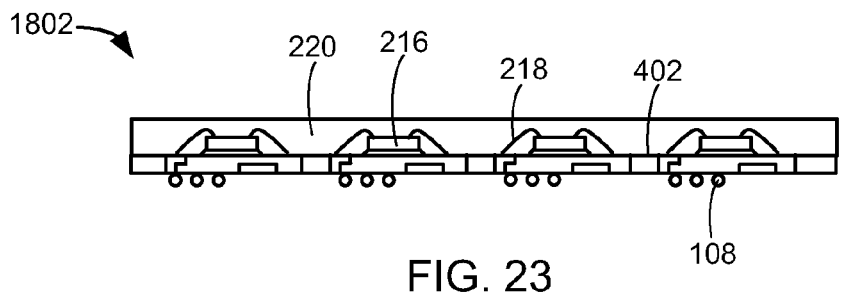
FIG. 23 is the structure of FIG. 22 in a second molding phase.

Referring now to FIG. 23, therein is shown the structure of FIG. 22 in a second molding phase. A molding compound, such as an epoxy molding compound, covers the top side 402 of the lead frame strip 1802 forming the second encapsulation 220. The second encapsulation 220 covers the semiconductor device 216 and the internal interconnects 218. The external interconnects 108 attach to the bond sites 1602 of FIG. 16 exposed in the solder mask 1702 of FIG. 19.

Figure 24:
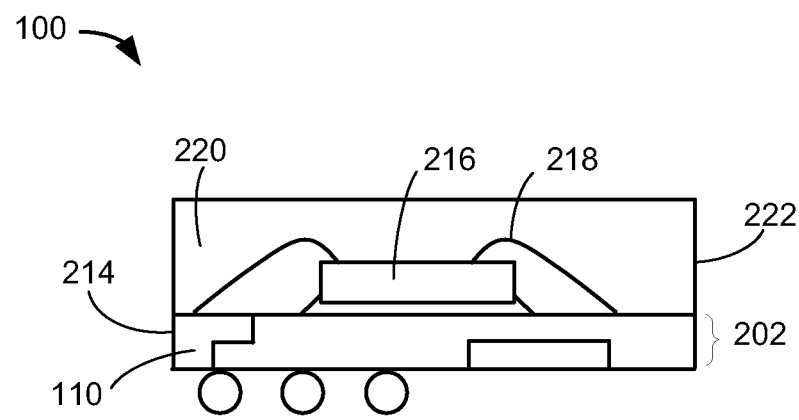
FIG. 24 is the structure of FIG. 23 in a singulating phase.

Referring now to FIG. 24, therein is shown the structure of FIG. 23 in a singulating phase. The singulation may be performed by a number of different processes, such as sawing. The structure of FIG. 23 undergoes a singulating process forming the dual molded multi-chip package system 100. The cross-sectional view depicts singulating process forming the periphery sides 214 of the leads 110 coplanar with the encapsulation sides 222 of the second encapsulation 220. The semiconductor device 216, the internal interconnects 218, and the second encapsulation 220 are over the embedded integrated circuit package system 202.

Figure 25:
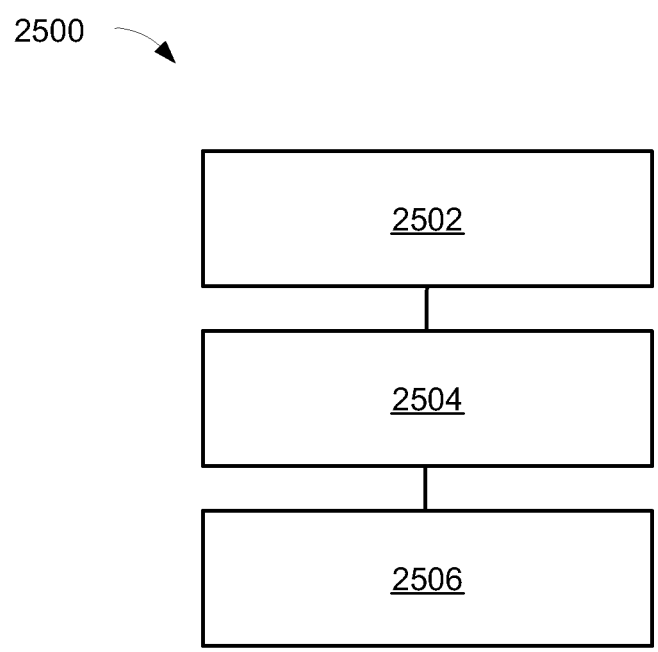
FIG. 25 is a flow chart of a dual molded multi-chip package system for manufacture of the dual molded multi-chip package system in an embodiment of the present invention.

Referring now to FIG. 25, therein is shown a flow chart of a dual molded multi-chip package system 2500 for manufacture of the dual molded multi-chip package system 100 in an embodiment of the present invention. The system 2500 includes: forming an embedded integrated circuit package system having a first encapsulation partially covering a first integrated circuit die and a lead connected thereto in a block 2502; mounting a semiconductor device over the first encapsulation and connected to the lead in a block 2504; and forming a second encapsulation over the semiconductor device and the embedded integrated circuit package system in a block 2506.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the dual molded multi-chip package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a dual molded multi-chip package system comprising;
    forming an embedded integrated circuit package system having a first encapsulation partially covering a first integrated circuit die and a lead connected thereto with a first active side of the first integrated circuit die exposed to the external environment,
    forming a solder mask over the first encapsulation;
    connecting a trace between and in direct contact with the lead and the first integrated circuit die;
    connecting an external interconnect in direct contact with an end of the trace;
    mounting a semiconductor device over the first encapsulation and connected to the lead; and
    forming a second encapsulation over the semiconductor device and the embedded integrated circuit package system, wherein forming the second encapsulation includes covering the lead and the first encapsulation coplanar with a first surface of the lead without covering the first active side.

2. The method as claimed in claim 1 wherein forming the solder mask includes forming the solder mask over the first active side.

3. The method as claimed in claim 1 wherein mounting the semiconductor device includes mounting a third integrated circuit die.

4. A dual molded multi-chip package system comprising:
    an embedded integrated circuit package system having a first encapsulation partially covering a first integrated circuit die and a lead;
    a semiconductor device over the first encapsulation;
    an internal interconnect between the lead and the semiconductor device;
    a trace between and in direct contact with the lead and the first integrated circuit die;
    an external interconnect in direct contact with an end of the trace;
    a second encapsulation over the semiconductor device and the embedded integrated circuit package system, wherein the embedded integrated circuit package system has the first encapsulation partially covering the first integrated circuit die and the lead connected thereto with a first active side of the first integrated circuit die exposed to the external environment;
    the semiconductor device is attached to the first encapsulation with a first adhesive and connected to the lead;
    the second encapsulation is over the semiconductor device and the embedded integrated circuit package system without covering the first active side, wherein the second encapsulation includes a cover for the lead and the first encapsulation coplanar with a first surface of the lead, and further comprising:
    a solder mask over the first encapsulation.

5. The system as claimed in claim 4 further comprising an extension of the lead.

6. The system as claimed in claim 4 wherein the trace is between a bond site and the first integrated circuit die.

7. The system as claimed in claim 4, wherein the trace is under the first encapsulation.

8. The system as claimed in claim 4, wherein the semiconductor device is connected to the first integrated circuit die with the trace.

9. The system as claimed in claim 4 wherein the solder mask includes the solder mask over the first active side.

10. The system as claimed in claim 4 wherein the semiconductor device includes a third integrated circuit die.

* * * * *